United States Patent [19]

Yanagi

[11] Patent Number: 4,799,040
[45] Date of Patent: Jan. 17, 1989

[54] DATA CONVERSION CIRCUIT

[75] Inventor: Hisao Yanagi, Yokohama, Japan

[73] Assignee: Tokyo Shibaura Denki Kabushiki Kaisha, Kawasaki, Japan

[21] Appl. No.: 9,567

[22] Filed: Jan. 30, 1987

Related U.S. Application Data

[63] Continuation of Ser. No. 594,124, Mar. 28, 1984.

[30] Foreign Application Priority Data

Mar. 30, 1983 [JP] Japan ................................ 58-54465

[51] Int. Cl.⁴ ............................................ H03K 13/24
[52] U.S. Cl. ...................................... 341/101; 377/67; 377/77; 377/115; 377/116
[58] Field of Search .................. 340/347 DD; 377/63, 377/67, 77–81, 115–117

[56] References Cited

U.S. PATENT DOCUMENTS

| | | | |
|---|---|---|---|
| 3,174,106 | 3/1965 | Urban | 377/67 |
| 3,656,011 | 4/1972 | Weinberg | 377/63 |
| 3,778,773 | 12/1973 | Hood | 340/347 DD R |
| 3,885,167 | 5/1975 | Berglund | 377/67 |
| 4,224,531 | 9/1980 | Ebihara | 377/79 |

OTHER PUBLICATIONS

S. Muroga "VLSI System Design", 1982, p. 191.
Erickson, "IBM Technical Disclosure Bulletin", vol. 21, no. 2, Jul. 1978, pp. 807–801.

Primary Examiner—William M. Shoop, Jr.
Assistant Examiner—Brian Young
Attorney, Agent, or Firm—Foley & Lardner Schwartz, Jeffery, Schwaab, Mack, Blumenthal & Evans

[57] ABSTRACT

A data conversion circuit is constructed in such a manner that a plurality of flip-flop series, each including tandem connected master/slave flip-flops, are provided and driven by plural phase numbers of clock signals which have no overlap therebetween, so that a parallel data is obtained with a serial data supplied to the flip-flop series, or a serial data is obtained with a parallel data supplied to the flip-flop series. The clock signals employed here have no overlap between each of the corresponding phases of the signals.

5 Claims, 7 Drawing Sheets

DATA CONVERSION CIRCUIT

This application is a continuation of application Ser. No. 594,124 filed Mar. 28, 1984.

BACKGROUND OF THE INVENTION

The present invention relates to a data conversion chart for converting serial data to parallel data or for converting parallel data to serial data.

The data conversion circuit of this kind is generally constructed using a shift register. The shift register is initiated into operation with clock signals supplied to each flip-flop of which the shift register is made up.

The transmission lines for the clock signals to each flip-flop, however, have some stray capacitance or the like. The clock signals are therefore transmitted with some delay so that the flip-flops in the shift register cannot operate in completely precise synchronization with each other.

FIG. 1 shows a serial to parallel data conversion circuit according to a prior art. The data conversion circuit converst a serial signal ST into respective parallel signals Q1, Q2, Q3 and Q4, and master/slave flip-flops F10, FF20, FF30 and FF40 are provided each in correspondence with particular bit of the parallel signals. A more detailed circuit construction of each of the flip-flops is shown in FIG. 1A, and in FIG. 1B a more concrete version thereof is shown. The master/slave flip-flops FF10, FF20, FF30, and FF40 comprise master flip-flops FF11, FF21, FF31 and FF41, and slave flip-flops FF12, FF22, FF32 and FF42. The master flip-flops and slave flip-flops each comprise a transfer gate TC and an inverter I, the master flip-flop being supplied with a clock CLK as its input, and the slave flip-flop with a clock $\overline{CLK}$. Each flip-flop is constructed as shown in FIG. 1B, with a MOS logic circuit. In the logic circuit, the transfer gate TG is made of a single MOS FET, and the inverter I is made of a pair of P and N-channel MOS FETs, that is, $Q_{11}$, $Q_{12}$ and $Q_{21}$, $Q_{22}$.

The description given hereinbelow is made by using the symbols depicted in FIG>1 or FIG. 1A for the purpose of convenience for drawing figures. Note that each flip-flop, corresponding to a respective master or slave flip-flop, has not only the transfer gate TG and inverter I, but also a stray capacitance CG as well, as shown in FIG. 2.

The operation of the conventional shift register is discussed with reference to FIG. 3. The input of a serial signal SI passes through the flip-flop FF11 during the time when a clock signal CLK takes an H level to thereby deliver an output Qa, which is applied to an input terminal D of the flip-flop FF12. The data of the flip-flop FF11 is held by the stray capacitance Cg after the clock signal CLK turns to an L level. At the same time in response to the clock signal CLK inverted by the inverter INV, the flip-flop FF12 outputs the data which has been held by the flip-flop FF11. Similarly to the above, in the master/slave flip-flops FF20, FF30 and FF40, the input of the serial signal SI is successively transferred to and held at respective flip-flops FF21, FF22, FF31, FF32, FF41 and FF42 which constitute the master/slave flip-flops, in synchronization with the clock signal CLK. Thus, an output of parallel signals Q1, Q2, Q3 and Q4 is obtained.

With the shift register described above, there has been some problems, however, in that a so-called race phenomenon occurs due to a time delay caused by a wiring in the integrated circuit of the inverter. More particularly, reference is made to FIG. 4 which is a portion of an equivalent circuit to FIG. 1 and is depicted by placing particular emphasis upon the clock signals CLK, $\overline{CLK}$. The transmission lines of the clock signals CLK, $\overline{CLK}$ contain wiring resistances R1, R2, R3, R4 and stray capacitances C1, C2, C3, C4, which cause a signal delay. Therefore, a phase delay of $\Delta t$ arises between the clock signals CLK and $\overline{CLK}$, as shown in FIG. 5. Thus, a time duration exists during which both clock signals CLK and $\overline{CLK}$ matinain H level, so that the output Qb of the inverter I3 is transferred to the inverter I4 to change its output Q2 without being interrupted by the transfer gate TG4. A tunneling phenomenon between inverters occurs which is generally called a race phenomenon.

SUMMARY OF THE INVENTION

It is therefore an object of the present invention to provide a conversion circuit for and between a serial data and a parallel data in which a race phenomenon does not take place.

It is another object of the present invention to provide a data conversion circuit for converting data, without accompanying the race phenomenon, by providing reference clock signals.

It is a further object of the present invention to provide a data conversion circuit which can operate with a low power consumption.

DETAILED DESCRIPTION OF THE INVENTION

Now referring to FIGS. 6 to 12, some preferred embodiments according to the present invention are described hereinbelow.

Figure 1:
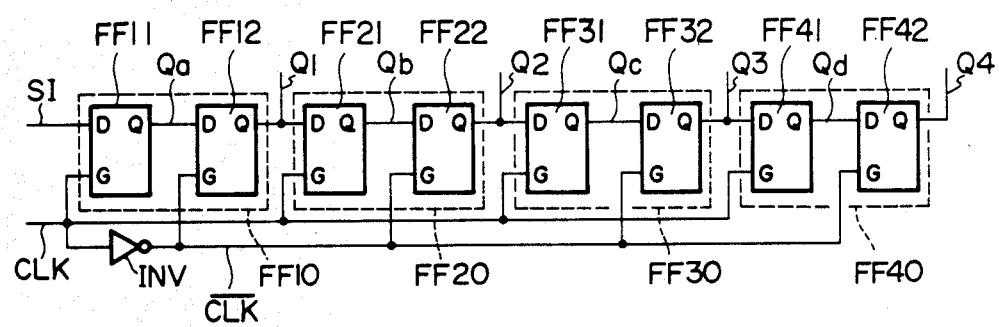
FIG. 1 is a schematic circuit diagram illustrating a construction of a prior art data conversion circuit for converting serial data into parallel data.
Figure 1A:
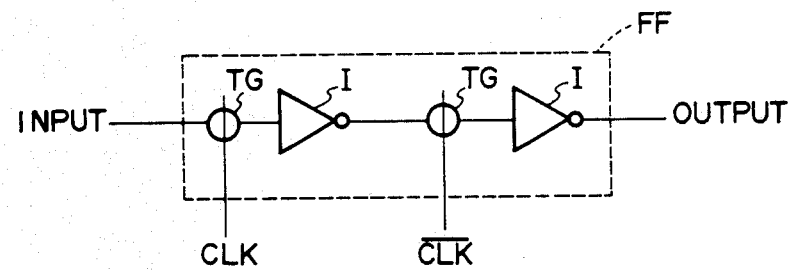
FIGS. 1A and 1B are schematic circuit diagrams illustrating more concrete construction of flip-flops constituting the conversion circuit of FIG. 1.
Figure 1B:
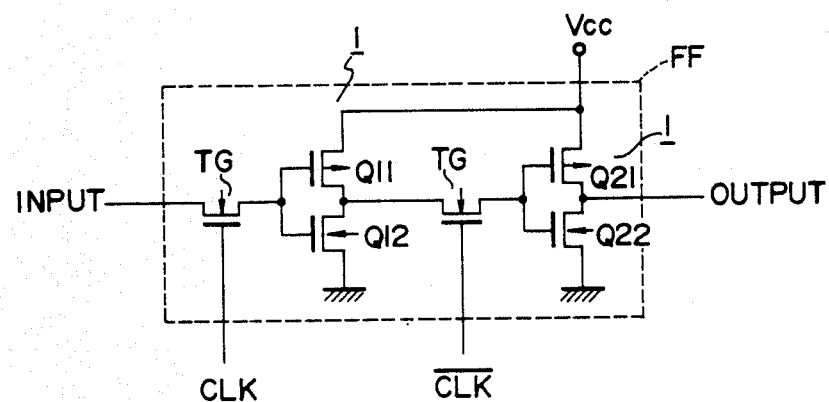
Figure 2:
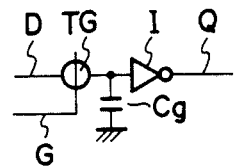
FIG. 2 illustrates a stray capacitance which appears at the flip-flop circuit.
Figure 3:
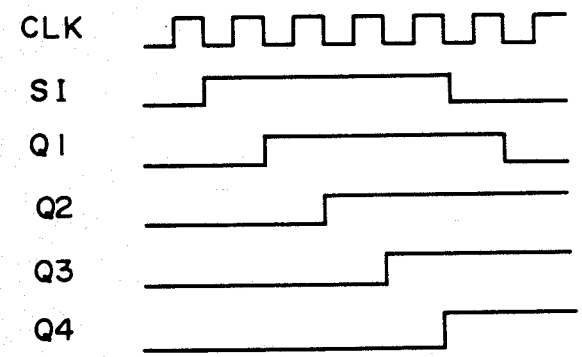
FIG. 3 is a timing chart of signal waveforms appearing at each circuit section of the circuit of FIG. 1.
Figure 4:
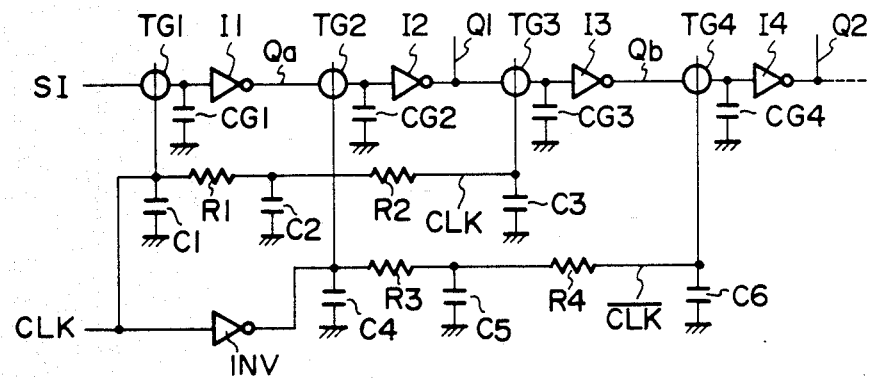
FIG. 4 is a schematic circuit diagram in which the flip-flops in FIG. 1 are shown using the representation given in the circuit of FIG. 2.
Figure 5:
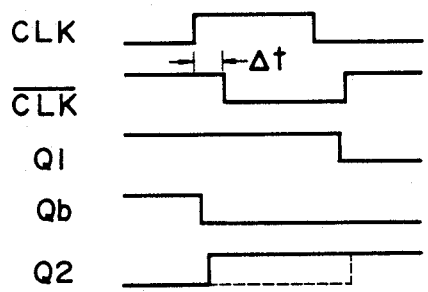
FIG. 5 is a timing charge of signal waveforms appearing at the circuit section in FIG. 4 including TG3, TG4, and $I_3$, $I_4$.
Figure 6:
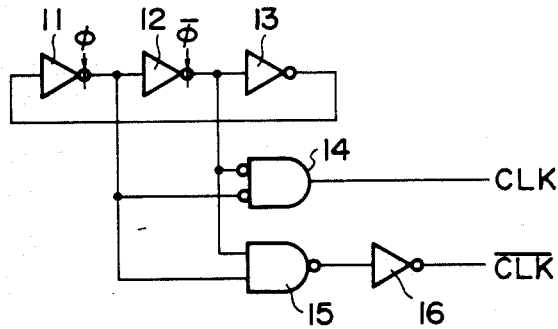
FIG. 6 is a circuit diagram of a clock signal generator circuit in which a two-phase clock generator circuit is employed for use with the conversion circuit according to the present invention.
Figure 6A:
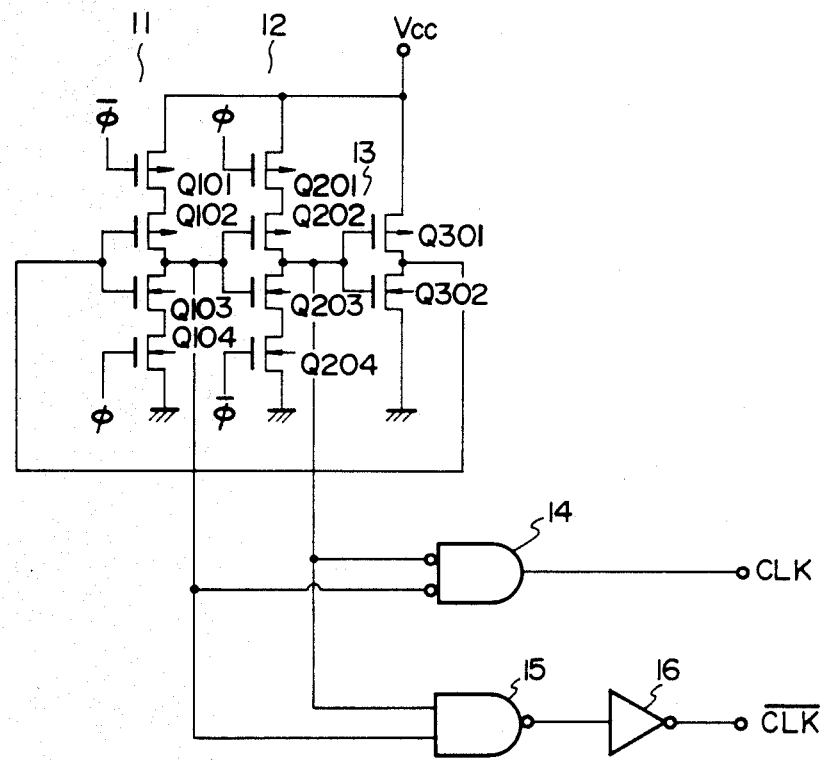
FIG. 6A is a more concrete circuit diagram of the circuit shown in FIG. 6.
Figure 7:
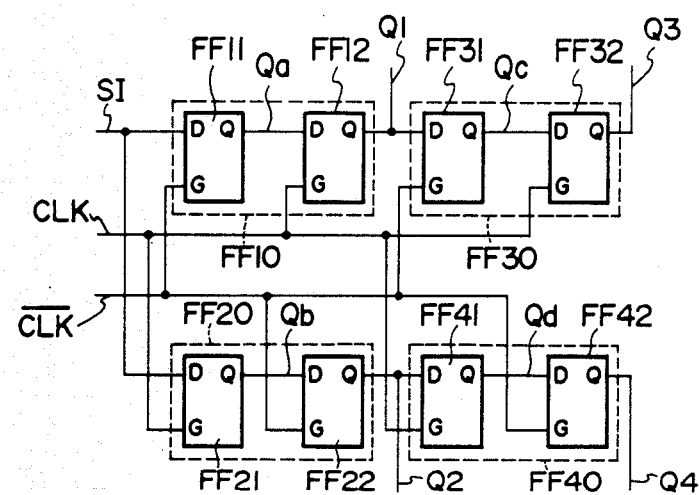
FIG. 7 is a schematic circuit diagram showing an embodiment of the conversion circuit according to the present invention, wherein the circuit is intended for conversions of serial data into four-bit parallel data.
Figure 8:
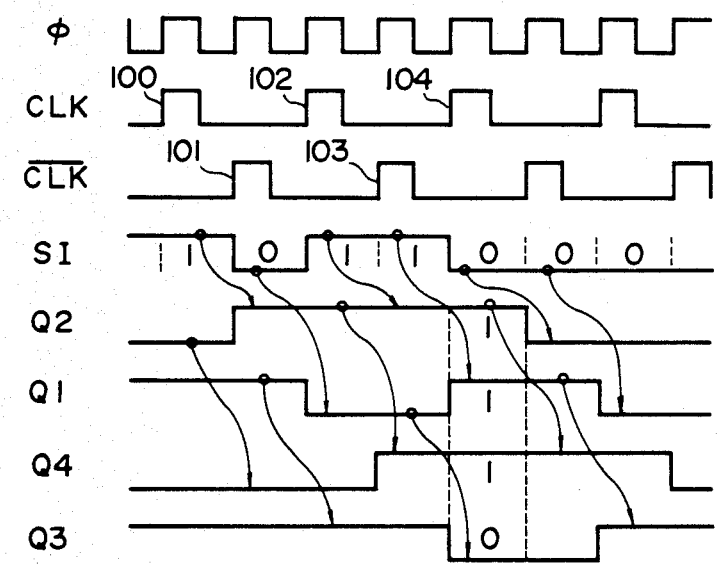
FIG. 8 is a timing charge of signal waveforms appearing at each circuit section of the circuit of FIG. 7.
Figure 9:
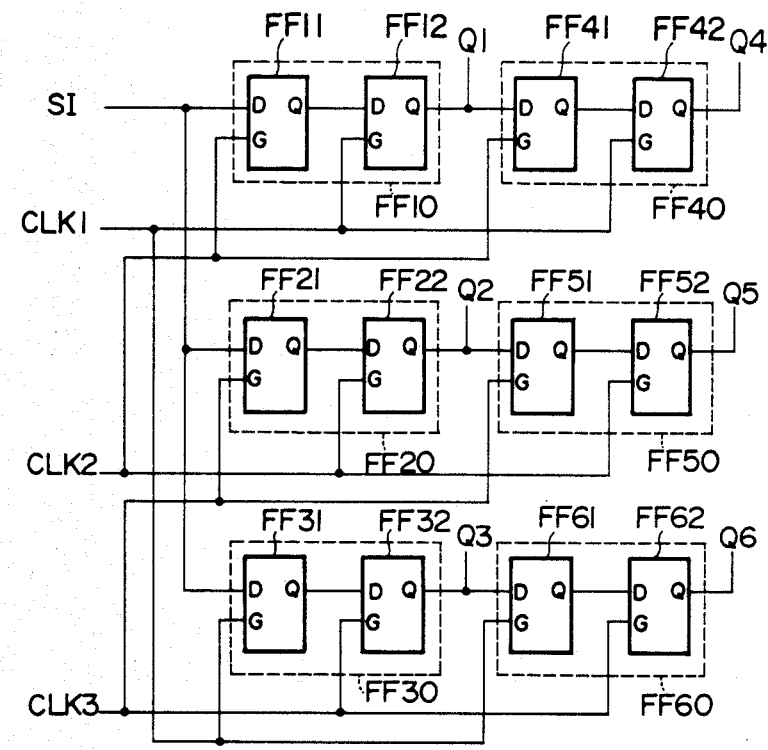
FIG. 9 is a schematic circuit diagram showing another embodiment of the conversion circuit according to the present invention, wherein the circuit is intended for conversion of serial data into six-bit parallel data.
Figure 10:
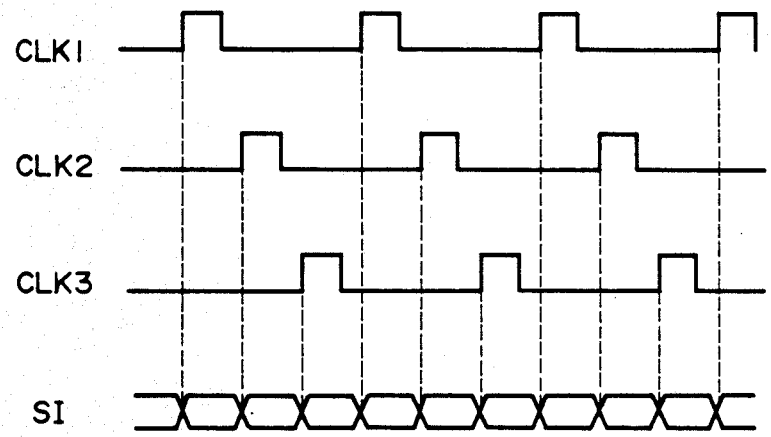
FIG. 10 is a timing chart of the waveforms of the serial data input and clock signals in the circuit of FIG. 9.
Figure 11:
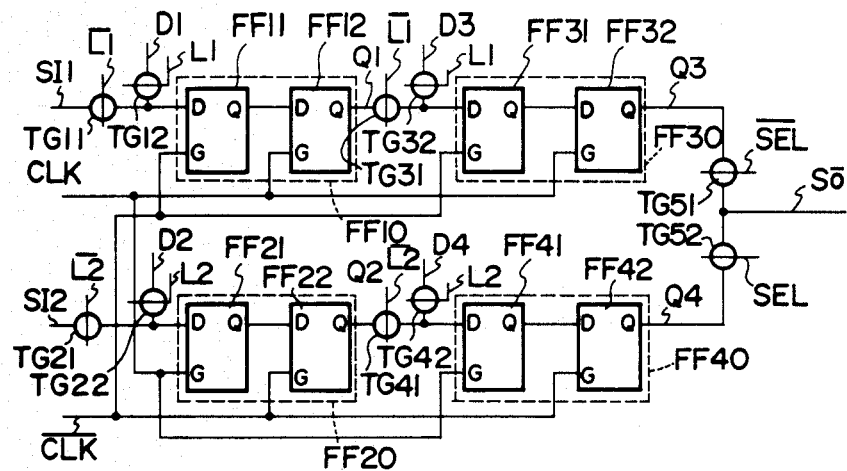
FIG. 11 is a schematic circuit diagram of a further embodiment of the conversion circuit according to the present invention, wherein the circuit is intended for conversion of parallel data into serial data.
Figure 12:
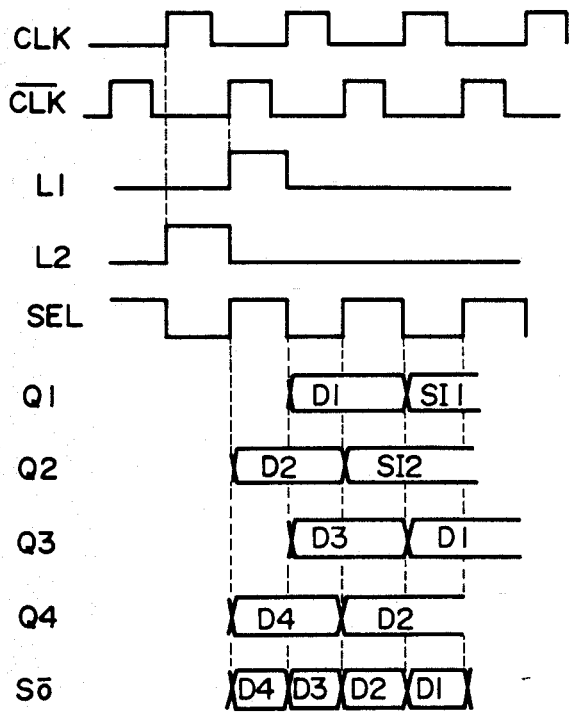
FIG. 12 is a timing charge of signal waveforms appearing at each circuit section of the circuit of FIG. 11.

FIGS. 6 to 10 are shown for illustrating the embodiments with respect to serial to parallel data conversion, and FIGS. 11 and 12 show a further embodiment for parallel to serial data conversion. Referring now to FIG. 6, there is shown illustratively a clock circuit construction by which clock signals CLK and $\overline{CLK}$ are generated. The clock circuit comprises clocked inverters 11, 12 to which reference clock signals $\phi$ and $\overline{\phi}$ are inputted, an inverter 13, an inverted AND gate 14, an NAND gate 15, and an inverter 16. A circuit portion including the clocked inverters 11, 12 and the inverter 13 is more concretely illustrated in FIG. 6A. As shown in FIG. 6A, the clocked inverters 11, 12 are each constructed with a pair of MOSs $Q_{102}$, $Q_{103}$ (or $Q_{202}$, $Q_{203}$) constituting an inverter, and gate MOSs $Q_{101}$, $Q_{104}$, (or $Q_{201}$, $Q_{204}$). The inverter 13 is constructed with a pair of MOSs $Q_{301}$, $Q_{302}$. The clock circuit thus constructed frequency-divides the reference clock signals $\phi$ and $\overline{\phi}$ b half so as to generate clock signals CLK and $\overline{CLK}$ having two times as high frequency as that of the reference clock signal, and differing 180 degrees in phase from each other. The clock signals CLK and $\overline{CLK}$, as shown in FIG. 8, have a feature that even if a time delay is incorporated to some extent, there is no possibility of an overlap between the clock signals which would concurrently energize the transfer gates. FIG. 7 shows a shift register which receives the above clock signals CLK, $\overline{CLK}$ and generates four-bit parallel signals Q4, Q3, Q2, and Q1. In the shift register, master/slave flip-flops FF10 and FF30 respectively corresponding to an odd number bit are connected in tandem to each other to form an odd number flip-flop series, and master/slave flip-flops FF20 and FF40 respectively corresponding to an even number bit are connected in tandem to each other to form an even number flip-flop series. For the master/slave flip-flops FF10 and FF30 which form the odd number flip-flop series, the master flip-flops FF11 and FF31 are supplied with clock signal $\overline{CLK}$, while the slave flip-flops FF12 and FF32 are supplied with the clock signal CLK. For the master/slave flip-flops FF20 and FF40 which form the even number flip-flop series, the master flip-flops FF21 and FF41 are supplied with the clock signal CLK as is opposite to the case of the odd number flip-flop series, while the slave flip-flops FF22 and FF42 are supplied with the clock signal $\overline{CLK}$.

The operation of the flip-flops is now described with reference to FIG. 8. A serial input signal SI is sequentially inputted in the order of "1", "0", "1" and "1", wherein "1" represents an H level and "0" represents an L level. The first order signal "1" is read into the flip-flop FF21 at a leading edge 100 of the clock signal CLK, and is output as Q2 from the flip-flop FF22 at a leading edge 101 of the clock signal $\overline{CLK}$. At the same time instant, the second order signal "0" is read into the flip-flop FF11 at a leading edge 101 of the clock signal $\overline{CLK}$, and is output as Q1 from the flip-flop FF12 at a leading edge 102 of the clock signal CLK. Simultaneously with this time instant, the flip-flop FF21 reads the third order signal "1", and the flip-flop FF41 reads the output Q2, that is, the first order signal "1". At a leading edge 103 of the following clock signal $\overline{CLK}$, the flip-flop FF22 outputs the third order signal "1" as its output Q2, and the flip-flop FF42 outputs the first order signal "1" as its output Q4. At this time instant, the flip-flop FF11 reads the fourth signal "1", and the flip-flop FF31 reads the output Q1, that is, the second order signal "0". At a leading edge 104 of the following clock signal CLK, the flip-flop FF12 outputs as Q1 the fourth order signal "1", and the flip-flop FF32 outputs as Q3 the output Q1, that is, the second order signal "0". At this time, the third order signal "1" has been outputted as Q2, and the first order signal "1" has been outputted as Q4. It is appreciated therefore that the serial input signal SI is converted and outputted as the outputs Q4, Q3, Q2 and Q1. The above operation is repeated so that the serial input signal SI is converted into parallel output signals Q4, Q3, Q2 and Q1.

As seen from the above embodiment, the clock signals CLK and $\overline{CLK}$ which are readily obtained from a reference clock signal and have no overlap therebetween, are supplied to the shift register in order to carry out a serial to parallel or parallel to serial data conversion. Therefore, a race phenomenon can be eliminated.

FIG. 9 illustrates another embodiment for serial to parallel data conversion, in which a serial input signal SI is converted into parallel output signals Q6, Q5, Q4, Q2 and Q1. To this end, master/slave flip-flops FF10 to FF60 are provided, each of the master flip-flops and slave flip-flops thereof being driven by three-phase clock signals CLK1, CLK2, and CLK3 as shown in FIG. 10. As is similar to the two-phase clock signals CLK and $\overline{CLK}$ described with FIG. 8, the three-phase clock signals CLK1, CLK2 and CLK3 are also required to have no overlap to each other with respect to a time-domain. A circuit for generating such clock signals is well known in the art.

The preceding embodiments are intended for conversion of a serial input signal into parallel output signals, however, it is also possible to embody a shift register with a similar construction which converts parallel input signals into a serial output signal. However, in the latter case, it is necessary to provide a selector circuit for selecting, in synchronization with a reference clock signal, each output of the respective flip-flop series.

FIG. 11 is an exemplary circuit diagram according to one of such embodiments, in which four-bit parallel data D1 to D4 are converted into a serial data SO. The circuit comprises four master/slave flip-flops FF10, FF20, FF30 and FF40. Transfer gates TG11, TG12, TG21, TG22, TG31, TG32, and TG41, TG42 are respectively provided for each input of the master/slave flip-flops FF10 to FF40. Among the transfer gates, the transfer gates TG11, TG21, TG31, and TG41 are intended for delivering the output of the preceding stage circuit to the following stage circuit, and the transfer gates TG12, TG22, TG32, and TG42 are intended for controlling whether the parallel data D1 to D4 are to be transferred or not. The circuit shown in FIG. 11 is used for converting four-bit parallel data into a serial signal. In this case the intput terminals of the transfer gates TG11 and TG21 can be connected to either ground or power source terminal. In the case when the circuit is used for converting six-bit parallel data into a serial signal, those transfer gates are positively utilized.

The outputs of the master/slave flip-flops FF30 and FF40 are coupled through transfer gates TG51 and TG52 to an output terminal, thereby creating serial data $\overline{SO}$ through the transfer gates TG51 and TG52.

FIG. 12 shows a timing charge of signals to be supplied to each of the transfer gates or the flip-flops shown in the circuit of FIG. 11. In the figure, the waveforms indicated by symbols CLK and $\overline{CLK}$ represent clock signals to be supplied to each flip-flop FF10 to FF40, L1, $\overline{L1}$ and L2, $\overline{L2}$ represent parallel data load signals to be supplied to the transfer gates TG11, TG12, ..., TG41, TG42, and SEL and $\overline{SEL}$ represent select signals to be supplied to the transfer gates TG51, TG52.

These signals are supplied to each flip-flop or each transfer gate with a timing shown in the figure so that the parallel input data D1 to D4 are converted into a serial output data $\overline{SO}$.

As appreciated from the above description, the present invention enables provision of a data conversion circuit in which a race phenomenon does not occur. Particularly when there is insufficient room for a circuit providing n-phase clock signals due to some limitations on space, the present invention has an advantage that the n-phase clock signals can be generated using the reference clock which the circuit of this nature must essentially have in possession. Moreover, since the oeprating frequency is lowered by one n-th, the power consumption during operation is advantageously decreased.

What is claimed is:

1. A data conversion circuit for performing conversion between serial and parallel data comprising:
    a plurality of flip-flop series having master/slave flip-flops, the number of said master/slave flip-flops equal to the number of bits of said parallel data, said flip-flops having terminals for serial data and parallel data, respectively, and said flip-flops being divided into predetermined plural numbers of groups to respectively form said plurality of flip-flop series; and
    a clock signal generator circuit for generating clock signals, the phase number of said clock signals equal to the number of said plurality of flip-flop series and the respective phases of said clock signals not overlapping each other in phase, said clock signal generator circuit rendering to operate at the leading edge of said clock signals a master flip-flop and a slave flip-flop of the master/slave flip-flop contained in each of said flip-flop series, and also rendering said flip-flop series to operate in synchronization with each other;
    in which said flip-flop series are made operative upon said clock signals thereby to perform a data conversion between said serial and parallel data.

2. A data conversion circuit according to claim 1, in which said flip-flop series each has an input terminal for said serial data, an output terminal for said parallel data, and an input terminal for respective ones of said clock signals; and in which said serial data supplied to said input terminal therefor is converted into said parallel data.

3. A data conversion circuit according to claim 2, in which said flip-flop series each have first and second master/slave flip-flops connected tandem with respect to each other, and said first master/slave flip-flop of each of said flip-flop series is provided with said serial data as its input; whereby said parallel data are respectively derived from the output terminals of said first and second master slave flip-flops.

4. A data conversion circuit for converting a parallel data input into a serial data output comprising:
    a plurality of flip-flop series having master/slave flip-flops, the number of which master/slave flip-flops equal to the number of bits of said parallel data, said flip-flops each having terminals for said serial data and parallel data, respectively, and said flip-flops being divided into predetermined plural numbers of groups to respectively form said plurality of flip-flop series;
    in which each of the master/slave flip-flops of each of said flip-flop series has an input terminal for said parallel data;
    a clock signal generator circuit for generating clock signals the phase number of which is equal to the number of said plurality of flip-flop series and the respective phases of said clock signals not overlapping each other in phase, said clock signal generator circuit rendering to operate at the leading edge of said clock signals a master flip-flop and a slave flip-flop of the master/slave flip-flop contained in each of said flip-flop series, and also rendering said flip-flop series to operate in synchronization with each other; and
    a selector circuit for selecting an output of each of said flip-flops and forming said serial data.

5. The data conversion circuit for converting a parallel data input into a serial data output according to claim 4, in which said flip-flop series each have first and second master/slave flip-flops connected in tandem with respect to each other, and said parallel data input is supplied to said first and second master/slave flip-flops; whereby the output data from said second master/slave flip-flop of each of said flip-flop series is selectively derived therefrom in order to obtain said serial data output.

* * * * *